United States Patent [19]
Roos et al.

[11] Patent Number: 5,213,945
[45] Date of Patent: May 25, 1993

[54] DRY FILM PHOTORESIST FOR FORMING A CONFORMABLE MASK AND METHOD OF APPLICATION TO A PRINTED CIRCUIT BOARD OR THE LIKE

[75] Inventors: Leo Roos, Laguna Beach, Calif.; Fredrick J. Axon, Manchester, England; James J. Briguglio, Newport Beach, Calif.

[73] Assignee: Morton International, Inc., Chicago, Ill.

[21] Appl. No.: 735,507

[22] Filed: Jul. 25, 1991

Related U.S. Application Data

[62] Division of Ser. No. 428,261, Oct. 27, 1989, abandoned, which is a division of Ser. No. 160,895, Feb. 26, 1988, Pat. No. 4,889,790.

[51] Int. Cl.⁵ .................................. G03C 1/78
[52] U.S. Cl. .................................. 430/270; 430/273; 430/260; 430/263
[58] Field of Search ............... 430/270, 260, 262, 263, 430/271, 273, 281

[56] References Cited

U.S. PATENT DOCUMENTS 4,072,527  2/1978  Fan ........................................ 430/273
4,318,975  3/1982  Kuznetsov et al. ................. 430/273
4,559,292  12/1985  Geissler et al. ...................... 430/256

Primary Examiner—Marion E. McCamish
Assistant Examiner—S. Rosasco
Attorney, Agent, or Firm—Wayne E. Nacker; Gerald K. White

[57] ABSTRACT

A dry film for forming a solder mask includes a cover sheet, a photoimageable composition layer which is curable to form a solder mask and a top coat interposed between the cover sheet and the photoimageable composition layer which is selectively adherent to the photoimageable composition layer. The dry film is applied to a surface of a printed circuit board with a minor portion of the area of the photoimageable composition layer tacked to the printed circuit board. The cover sheet is peeled away. With heat and vacuum, the photoimageable composition layer is laminated to the irregular surface of the printed circuit board, conforming the photoimageable composition layer to the contours thereof and leaving the top coat as a protective covering over the photoimageable composition layer. The photoimageable composition layer is exposed to patterned actinic radiation, developed and cured to form a hard, permanent solder mask.

12 Claims, 5 Drawing Sheets

PRIOR ART
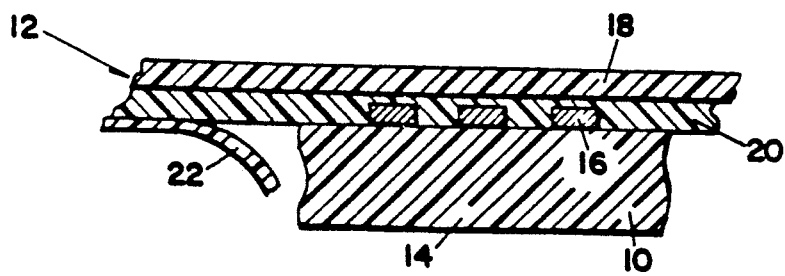
Fig. 1
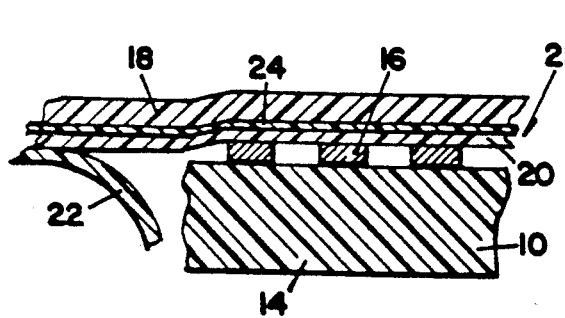 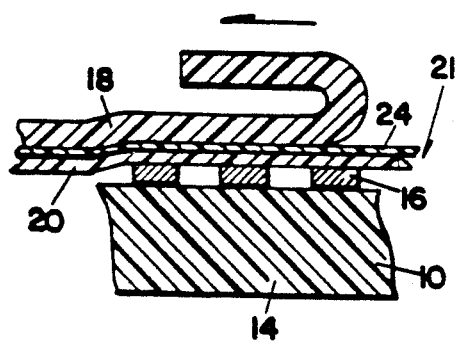
Fig. 2A  Fig. 2B
PRIOR ART  PRIOR ART
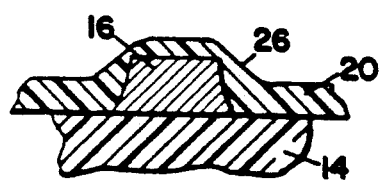 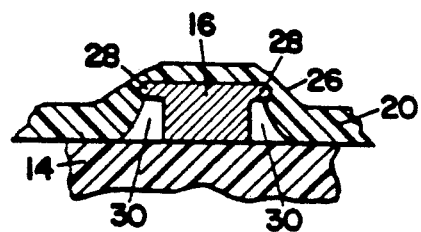
Fig. 3A  Fig. 3B

DRY FILM PHOTORESIST FOR FORMING A CONFORMABLE MASK AND METHOD OF APPLICATION TO A PRINTED CIRCUIT BOARD OR THE LIKE

This is a divisional of co-pending application Ser. No. 07/428,261 filed on Oct. 27, 1989, now abandoned, which is a divisional of Ser. No. 07/160,895 filed Feb. 26, 1988, now U.S. Pat. No. 4,889,790, issued Dec. 26, 1989.

The present invention is directed to dry films which form masks that conform to irregular surfaces and a method of forming such conformable masks. One aspect of the present invention is directed to a dry film which includes a photoimageable layer which is developable and curable to form a permanent solder mask over a printed circuit board or the like and to a method of forming a solder mask on a printed circuit board or the like using the dry film.

BACKGROUND OF THE INVENTION

A solder mask is a hard, permanent layer of non-conductive material which covers the surface of a printed circuit board or the like, encapsulating the traces of the printed circuit itself. By solder mask is meant herein a hard, permanent layer which meets the abrasion resistance tests as defined in IPC-SM-840A, Table 12, Summary of Criteria for Qualification/Conformance (Institute for Interconnecting and Packaging Electronic Circuits). The solder mask is patterned to fully cover the circuitry except for those portions intended to be exposed, e.g., for soldering to another component. Solder masks are typically formed from a layer of photoimageable composition which is applied to a surface of the printed circuit board. The photoimageable layer is exposed to actinic radiation which is patterned by means of a template or artwork. Subsequent to exposure, the photoimageable layer is developed in an organic solvent or an aqueous solution which washes away either exposed or unexposed portions of the layer (depending upon whether the photoimageable material is positive acting or negative acting). The portion of the layer which remains on the surface is then cured, e.g. with heat and/or UV light to form a hard, permanent solder mask intended to protect the printed circuitry for the life of the board.

One prior art method of applying the layer of photoimageable composition to the circuit board surface is to apply the material in liquid form and then either allow it to dry or partially cure the material to form a semi-stable layer.

There are a number of advantages to applying a photoimageable layer to a circuit board as a dry film rather than as a liquid. In particular, dry films are free of organic solvent and therefore eliminate this hazard from the workplace and eliminate the need for apparatus to protect the immediate work environment and the more general environment from organic solvent emissions. Typically, a dry film comprises a cover sheet of support material which is somewhat flexible but which has sufficient rigidity to provide structure to a layer of photoimageable composition which overlies one surface of the support sheet. Typically, the cover sheet is formed of polyester material, such as polyethylene terephthalate (PET), such as that sold as MELINEX ®.

To protect the photoimageable layer and to enable the dry film to be rolled, it is conventional that the exposed surface of the photoimageable layer be covered with a removable protective sheet e.g., a sheet of polyethylene. An example of such a dry film is sold as LAMINAR DM ® by the Dynachem Division of Morton Thiokol, Inc.

The method of use of such a prior art dry film is generally as follows. The protective sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Using heat and vacuum, the photoimageable layer is immediately laminated to the surface of the board. The cover sheet remains overlying the photoimageable layer, protecting the photoimageable layer from exposure to oxygen and from handling damage. The cover sheet also permits an artwork (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET support sheet is removed, permitting access to the exposed photoimageable layer by developer. Depending upon the composition of the photoimageable layer, the photoimageable layer is developed with organic solvent, aqueous developer, or semi-aqueous developer, i.e., a developer including both water and organic solvent. The photoimageable layer may either be positive acting, in which case the exposed portions are removed by developer, or negative acting, in which case the unexposed portions are removed by developer. Most photoimageable layers for preparing solder masks are negative acting. Most photoimageable composition layers require some cure subsequent to development to render the layer hard and permanent so as to serve as a solder mask. Depending upon the composition of the photoimageable layer, curing may be effected with heat and/or UV light.

Although a number of advantages accrue through the use of dry films as opposed to coating the circuit board with a liquid composition, there are some problems with solder mask-forming dry films which the present invention addresses.

Because the cover sheet of a conventional dry film is relatively rigid, the photoimageable layer cannot fully conform to the irregular contours of the printed circuit board, from which circuitry traces rise from the flat surface of the board itself. Because of this, the thickness of the photoimageable layer must be slightly greater than the elevation of the traces above the surface of the board. For example, if the traces rise 75$\mu$ above the surface of the board, the photoimageable layer will typically be about 100$\mu$ thick; when laminated to the board, approximately 25$\mu$ of photoimageable composition overlies the upper surfaces of the traces.

One unfortunate result of the solder mask being thicker than the elevation of the traces is that elevated regions of photomask exist between those portions of the circuitry from which photoimageable composition is removed during the development of the solder mask, e.g. those portions of the traces to which a component is to be soldered. Elevated regions are particularly problematic with respect to components which are surface-mounted to the printed circuit board. Components typically contain a plurality of pins which are each to be soldered to an exposed portion of a trace of the circuit board. If the component does not fit closely to the board, it may rest on the surface of photoimageable composition without adequate bonding being established between the pins and the traces. It would be desirable if low regions, or "valleys", rather than elevated regions existed between exposed trace portions.

Some common traces are narrower at the foot than at the top, in which case small overhangs extend outward along each side of each trace (an effect known as "mushrooming"). With both liquid compositions and conventional dry films, there inherently remains air-filled voids below such overhangs. The air trapped in such voids may produce some oxidation of the traces and may lead to eventual defects in the solder mask.

The present invention is directed to an improved dry film for forming a solder mask which eliminates some of the problems of both liquid application and conventional dry films. The present invention is also directed to a method of using a dry film to apply a photoimageable layer, which may be one which forms a solder mask or may be a primary photoresist, to a surface, particularly an uneven surface. Dry film carrying a primary imaging resist may be applied by the method of the present invention for forming excellent conformation for tab plating operations.

SUMMARY OF THE INVENTION

In accordance with the invention, there is provided a dry film for forming a solder mask on a printed circuit board or the like. The dry film includes a cover sheet formed of flexible, but generally non-conforming material, giving the dry film shape while allowing it to be rolled into a reel. On one surface of the cover sheet is a thin layer of material, referred to herein as a top coat, which is preferably soluble in the developer for the photoimageable material. The photoimageable composition forms a layer over the other surface of the top coat. A removable sheet (which is optional, but highly preferred) protects the photoimageable composition layer. The material which is used to form the top coat is selectively adherent to the photoimageable composition relative to its adherence to the cover sheet, whereby the cover sheet may be removed from the top coat and thereby leave the top coat as a protective covering for the layer of photoimageable composition.

To form a solder mask in accordance with the present invention, the protective, removable sheet is peeled away, and the exposed surface of the photoimageable composition layer is tacked to a minor portion of the surface of the printed circuit board. The cover sheet is removed, leaving the top coat as a protective covering on the layer of photoimageable composition. At this time, the layer of photoimageable material is firmly laminated to the surface of the board with the use of heat and vacuum, conforming the photoimageable composition layer to the contours of the board and substantially encapsulating the traces. The photoimageable composition is then exposed to patterned actinic radiation through the top coat. A developer is used to remove either exposed or non-exposed portions of the photoimageable composition layer, leaving the remaining portion of the layer laminated to the circuit board. Subsequently, the portions of the photoimageable composition layer remaining on the circuit board are cured, e.g., with heat and/or UV light. A similar process is useful for applying and developing a conformable primary resist layer, although heat and UV curing are not used.

BRIEF DESCRIPTION OF THE DRAWINGS

FIG. 1 is a cross-sectional view of a conventional dry film used for forming a solder mask, shown being applied to a printed circuit board.

FIG. 2A is a cross-sectional view of a dry film in accordance with the invention used for forming a solder mask.

FIG. 2B shows removal of the cover sheet from a dry film tacked to a printed circuit board.

FIG. 3A is a cross-sectional view of a trace on a printed circuit board covered by a solder mask formed from a prior art, liquid photoimageable composition.

FIG. 3B is a cross-sectional view of an alternative trace on a printed circuit board covered by a solder mask formed from a prior art, liquid photoimageable composition.

FIG. 6 is a 300× magnification of a 50μ trace covered with a 50μ solder mask. FIG. 7 is a 750× magnification of a 75μ trace covered with a 50μ solder mask. FIG. 8 is a 300× magnification of a 50μ trace having lateral overhangs and being covered with a 50μ solder mask. FIG. 9 is a 100× magnification of 50μ traces covered with a 50μ solder mask.

DETAILED DESCRIPTION OF CERTAIN PREFERRED EMBODIMENTS

Figure 4A:
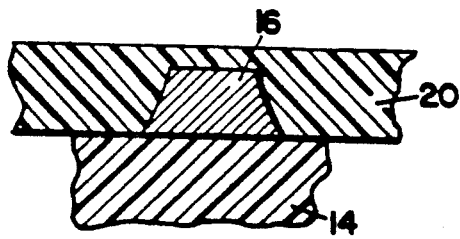
FIG. 4A is a cross-sectional view of a trace on a printed circuit board covered by a solder mask formed from a prior art, conventional dry film.

Illustrated in FIG. 1 is an illustration of a circuit board 10 being covered with a prior art dry film 12. The circuit board comprises a board 14 of non-conductive material, e.g., formed of epoxy, and the conductive traces 16 which comprise the printed circuit. The dry film comprises a cover sheet 18 of flexible, but generally non-conforming material, typically a polyester, such as polyethylene terephthalate, a layer 20 of photoimageable material which eventually is processed to become the solder mask and a protective sheet 22 formed, for example, of polyethylene.

Typically the dry film is supplied from a reel (not shown) to the circuit board 10. Just prior to application to the surface of the circuit board, the protective sheet 22 is peeled away, as shown, e.g., by rolling onto a take-up reel (not shown). As the photoimageable layer is applied to the surface of the circuit board, it is laminated thereto with heat, pressure and vacuum. Although the cover sheet 18 is flexible, it is non-conforming and therefore retains its flat configuration when the dry film 12 is applied to the circuit board 10. The photoimageable composition layer 20 during lamination conforms at its contact surface to the circuit board from which the traces 16 protrude; however, the surface of the photoimageable composition layer which is in contact with the cover sheet 18 remains flat. In order that the photoimageable composition layer 20 may fully encapsulate the traces 16, it must be thicker than the elevation of the traces above the board 14 of non-conductive material. Standard requirements are that the thickness of the solder mask over all portions of the traces be at least $18\mu$. Because the great majority of traces are elevated $50\mu$ or more above the surface of the board 14, the photoimageable layer must usually be $68\mu$ or thicker. Conventional dry films 12 for forming solder masks typically have photoimageable layers $100\mu$ thick.

Illustrated in FIG. 2A is a dry film 21 in accordance with the present invention. This dry film 21 also includes a cover sheet 18, a layer 20 of photoimageable composition which is processable to form a hard, permanent solder mask and an optional, but preferred, protective sheet 22. In addition, the dry film 21 includes a top coat 24 intermediate the cover sheet 18 and the photoimageable composition layer 20. The material for the top coat 24 is selected to have selective adherence to the photoimageable composition layer 20 relative to its adherence to the cover sheet 18, whereby the cover sheet may be peeled away from the remaining layers 20, 24 of the circuit board-adhered dry film, leaving the top coat 24 protecting the photoimageable layer 20. The top coat 24 is formed of material which also is selected for oxygen-impermeability, whereby it protects the underlying layer of photoimageable composition 20 from oxygen inhibition during free radical photopolymerization in the exposure step. Preferably, the top coat is also selected to be soluble in the developer for the photoimageable material, whereby the top coat is removed during the development process. It is possible, however, that the top coat not be soluble in the developer, in which case the top coat must be removed in a predevelopment step. The top coat material is further selected for transparency, strength and flexibility.

Dry film for applying photoresist layers having a similar configuration are described in the U.S. Pat. No. 4,530,896 issued Jul. 23, 1985 to Christensen et al. and in U.S. patent application Ser. No. 06/931,396 filed Nov. 14, 1986, the teachings of each being incorporated herein by reference. U.S. Pat. No. 4,530,896 is limited to application of very thin resist coatings. Primary photoresists are typically applied to a metal-covered substrate in order to define the pattern of circuitry traces on a printed circuit board. In each of these references, a dry film is described having, in order, a cover sheet, an intermediate layer which acts as a top coat after removal of the cover sheet, a photoresist composition layer and an (optional) protective sheet. Although the order of layers are similar to those of the dry film of the present invention, there are several reasons why it would not be obvious to one with ordinary skill in the art that there would be advantages to a solder mask-forming dry film of similar laminate arrangement.

It is a major advantage in a dry film for applying a primary photoresist layer to a substrate that the relatively thick cover sheet be removed prior to imaging, thereby substantially improving the resolution of the image which may be achieved. Although, similar advantages of resolution are obtained, in fact, with a solder mask-forming dry film, resolution of image is of substantially less concern with solder masks than with primary photoresists.

The main advantages of a solder mask dry film having this laminate arrangement are achieved through the application of the solder mask by the novel process of the present invention. The novel process of the present invention closely conforms the photoimageable layer 20, which eventually forms the solder mask, to the contours of a circuit board surface which are irregular due to the elevated traces. In contrast, a photoresist layer is generally applied to a substantially flat surface. By conforming the photoresist layer closely to the circuit board surface, excellent encapsulation of the traces is achieved. Also, a much thinner photoimageable composition layer may be used than has been used in prior art, solder mask-forming dry films.

As in the case with the conventional dry film 12, the protective sheet 22 is initially peeled from the photoimageable layer 20, and the exposed surface of the photoimageable layer is applied over a surface of the printed circuit board as seen in FIG. 2A. Unlike the case with the conventional dry film 12, the dry film in accordance with the present invention is not laminated to the board at the time of application. Rather, slight pressure is used to tack the dry film 21 to the board. Either cold-tacking or hot-tacking may be used. By cold-tacking is generally meant at room temperature, e.g., 20°-25° C. Hot-tacking may be at temperatures up to about 70° C. The dry film 21 is not tacked to the entire surface, but only to a portion sufficient to provide adequate adherence to the board so as to allow removal of the cover sheet 18 without removal of the remaining layers 20, 24 of the dry film 21 from the circuit board 10. By tacking only a small portion, typically 5% or less of the entire surface area of the dry film which lies over the board, passageways are left between the dry film 21 and the board 10 for subsequent removal of air by application of vacuum. If the dry film is applied by machine, edges, e.g., the leading and trailing edge, may be tacked. If manually applied, tacking at the corners is sufficient. Mechanical pressure, such as that which may easily be provided by a human finger, is sufficient for tacking.

At this time, the cover sheet 18 is removed. Because only a minor portion of the dry film 21 area is tacked to the circuit board 10, the cover sheet 18 is carefully removed. FIG. 2B shows a preferred mode of removal in which the cover sheet 18 is peeled back in a plane parallel to the plane of the circuit board 10 (as opposed to lifting in a generally perpendicular direction which would tend to remove the photoimageable layer from the circuit board 10).

With the cover sheet 18 removed, the photoimageable layer 20 with the top coat 24 thereon is now vacuum-laminated at elevated temperature to the board. A vacuum of at least about 0.3 millibar is used and preferably a vacuum of at least about 1 millibar. Laminating temperatures range from about 40° C. to about 100° C., a range of about 60° C. to about 80° C. being preferred. Because the cover sheet 18 is removed, the two remaining layer (photoimageable layer 20 and top coat 24)

conform easily to the contours of the irregular surface of the circuit board 10.

During lamination, the remaining layers 20, 24 conform very closely to the circuit board and provide several advantages which can best be appreciated with respect to FIGS. 3A, 3B, 4A, 4B, 5A, and 5B and the photographs which are FIGS. 6-9. As it turns out, the thin layer which comprises the top coat 24 remains fully intact during the conforming process, a result which would not necessarily have been predictable in advance.

FIG. 3A illustrates a solder mask which was initially applied as a liquid photoimageable composition. Being a liquid, the layer generally conforms to the uneven contours of the circuit board. On the top of each trace 16, the layer is of generally uniform thickness; however, in the regions 26 of the knees of the traces, i.e., the lateral edges, the layer greatly thins out, typically being only about 50% as thick as the portion of the layer which covers the flat upper surface of the trace. Frequently, the layer 20 in the regions 26 of the knees is even thinner relative to the portions of the layer on the flat upper surface of the trace.

Illustrated in FIG. 3B is a solder mask 20 covering a "mushroomed" trace 16' having overhangs 28 on each side. Not only is the solder mask thin in the regions 26 of the knees, but a void, air-filled space 30 is left below each overhang 28.

FIG. 4A illustrates a solder mask formed from a photoimageable layer 20 of a conventional dry film 12. The outer surface of the solder mask has the flat configuration of the cover sheet 18 which was removed subsequent to lamination, while the laminated surface conforms generally to the irregular contours of the circuit board 10. The solder mask which is shown in FIG. 4A is satisfactory from the standpoint of adequately encapsulating the traces 16. It is to be noted, however, that the thickness of the photoimageable layer 20 and solder mask formed therefrom is, of necessity, greater than the elevation of the trace, requiring a relatively large amount of photoimageable composition to be used. This thickness represents a limitation to the resolution of photoimaging which can be achieved.

Figure 4B:
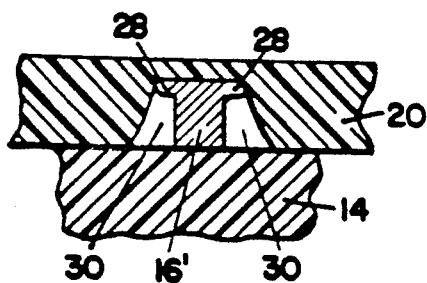
FIG. 4B is a cross-sectional view of an alternative trace on a printed circuit board over which a solder mask formed from a prior art, conventional dry film is applied.

FIG. 4B illustrates a solder mask resulting from a photoimageable layer 20 of a conventional dry film and covering "mushroomed" traces 16' having lateral overhangs 28. Although thickness of the solder mask above the trace 16' is adequate, air-filled voids 30 exist below the overhangs 28.

Figure 5A:
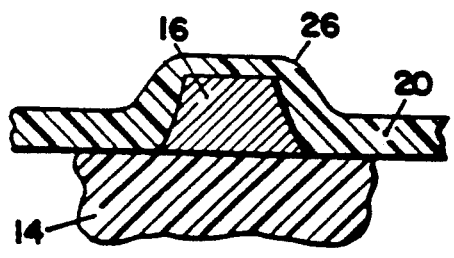
FIG. 5A is a cross-sectional view of a trace on a printed circuit board encapsulated by a solder mask formed from a dry film in accordance with the present invention.
Figure 5B:
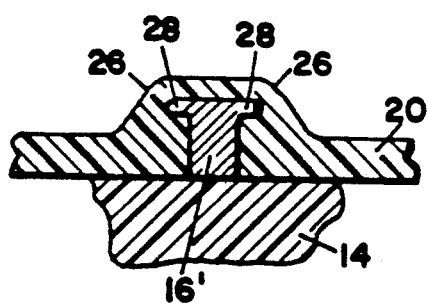
FIG. 5B is a cross-sectional view of an alternative trace on a printed circuit board encapsulated by a solder mask formed from a dry film in accordance with the present invention.

FIGS. 5A and 5B illustrate solder masks formed from photoimageable composition layers 20 of dry films 21 produced in accordance with the present invention. During the lamination, the remaining layers 20, 24 of the dry film 21 very substantially conform to the irregular surface contours of the circuit board. In each case (5A and 5B), the thickness of the photoimageable layer 20 which was used to form the photomask was equal to or less than the elevation of the trace 16 or 16'; however, the surface of the circuit board is fully covered by the solder mask with the traces 16 or 16' fully and adequately encapsulated. It is to be noted that the photomask in the regions 26 of the knees of the traces are substantially as thick as over the upper flat surfaces of the traces. When using a dry film in accordance with the present invention, the resulting solder mask has thickness in the regions 26 of the knees of the traces which is at least about 70% of the thickness of the solder mask over the upper flat surface of the traces (over more than about 90% of the linear length of the traces). It is also to be noted in FIG. 5B where a trace 16' has overhangs 28, conformance of the layer 20 during vacuum/heat lamination is sufficient to substantially remove air-filled voids from below the overhangs 28. Even though substantial deformation of the photoimageable composition layer 20 is required to achieve this conformance, the top coat 24 maintains its integrity during lamination.

Subsequent to lamination, the solder mask is formed by processing the layer of photoimageable composition in a conventional manner. Artwork is laid over the remaining layers 20, 24 of the dry film; the top coat 24 prevents the artwork from sticking.

The photoimageable layer 20 is exposed to patterned actinic radiation through the protective top coat 24. Although resolution is generally not as critical when developing solder masks as it is in developing photoresist layers, the thinness of the top coat 24, typically in the range of about 2–3$\mu$ (as opposed to a cover sheet, typically in the range of about 25$\mu$, through which photoimageable composition layers 20 of conventional solder mask-forming dry films 12 must be exposed) contributes to improved resolution. Further contributing to enhanced resolution is the relative thinness of the photoimageable composition layer 20 itself. As noted above, with a conventional solder mask-forming dry film 12, which is intended to be exposed through the cover sheet 18, the photoimageable layer typically must cover traces 16 with elevation of 50$\mu$ or more, and the photoimageable layers are typically about 100$\mu$ thick. Because the photoimageable layer 20 of the dry film of the present invention is conformable to the surface contours of the circuit board 10, a thickness of 50$\mu$ or less is sufficient to cover traces elevated 50$\mu$ and even up to about 75$\mu$ above the flat surface of the board 14. Of course, a further advantage is substantially reduced levels of expensive photoimageable composition used to form the layer 20. An additional advantage of a thin, conforming photoimageable layer is that the solder mask which forms in the regions between the traces 16 is generally at or below the level of the traces. With conventional solder masks, slight elevated regions exist between the traces. Such elevated regions may result in the component, which is being soldered, sitting high on the solder mask and preventing pins of the component from being adequately soldered to exposed trace portions. Alternatively, the elevate regions may, during reflow, result in some of the pins of a soldered component breaking contact, causing the component to stand up at one end, an effect known as "tombstoning". Inadequate soldered contact and "tombstoning" are avoided when "valleys" instead of elevated regions exist between exposed portions of the traces.

After exposure to actinic radiation, the layers 20 and 24 are developed, the developer removing the top coat 24 and appropriate portions of the photoimaged layer 20.

In addition, the dry film solder mask of this invention has the same ability to "tent" via holes are conventional primary imaging or solder masks films. This is a very important part of the process and cannot be duplicated with simple liquid processes.

Generally, an additional cure follows development in order to harden the solder mask. Typically, heat and/or UV light are used to effect this cure.

The present invention is not primarily directed to materials from which the various sheets and layers are formed; and reference is again made to U.S. Pat. No. 4,530,896 and U.S. patent application Ser. No. 06/931,396. The cover sheet 18 is generally formed of a polyester, such as PET and is generally at least about 25μ, or thicker, and up to about 75μ thick.

PET, if used for the support sheet, is preferably surface-treated to provide adequate hydrophilicity or wetting angle so that it does not adhere strongly to the top coat. Preferably, the wetting or contact angle of the cover sheet material is at least about 60° and is preferably 75° or less. One suitable PET cover sheet is sold under the trade designation Melinex-393 by ICI. This is a PET that is surface-treated on one side to enhance its hydrophilicity, i.e., increase its wetting angle.

Other suitable cover sheet materials include, but are not limited to polyamides, polyolefins, vinyl polymers, and cellulose esters.

Any photoimageable composition suitable for forming solder masks is suitable for practice of the invention.

The protective sheet 22 is selected to be removable from the photoimageable material, and is typically a polyethylene sheet, between about 15μ and about 35μ thick.

The top coat 24 is of a material which provides the requisite selective adherence. The top coat is typically from about 1μ to about 12μ thick, typically between about 2μ and about 5μ. When using a PET cover sheet and a photoimageable material which is developable in aqueous or alkaline aqueous developer, it is presently preferred to use a material consisting essentially of (a) between about 10 weight percent and 100 percent of a copolymer formed by the copolymerization of between about 95 and about 99 molar percent of polyvinyl acetate and between about 1 and about 5 molar percent of alkyl ester of acrylic acid and being hydrolyzed to at least about 75 percent; (b) up to about 90 weight percent of hydroxyethyl cellulose; and (c) up to about 10 weight percent of plasticizer.

The above described copolymers are sold under the trade designation VINOL-118 M by Air Products, and 4 weight percent solutions of these copolymers and have viscosities ranging from about 5 to about 65 centipoise at 20° C.

A plasticizer, if used, tends to lower the tack temperature of the top coat material, and tack temperatures below about 100° C. have been achieved using such plasticizers. A top coat composition having a lower tack temperature is easier to adhere to the photoimageable layer. Preferred plasticizers are low molecular weight compounds, e.g., below about 200, having two or more hydroxyl groups, such as glycerine, ethylene glycol and propylene glycol. While plasticizers desirably lower the tack temperature, they also increase oxygen permeability of the top coat; accordingly amounts of plasticizers in excess of about 10 by weight are desirably avoided.

Other suitable materials for top coat use include, but are not limited to, the group consisting of polyvinyl ether-maleic anhydride copolymers, water-soluble cellulose ethers, water-soluble salts of carboxyalkylcellulose, water-soluble salts of carboxyalkyl starch, polyvinyl alcohol, polyvinyl pyrrolidone, various polyacrylamides, various water-soluble polyamides, water-soluble salts of polyacryic acid, gelatin, ethylene oxide polymers, various starches and the like.

The method of forming the dry film is according to known procedures. The top coat and photoimageable composition layers are successively layered on the cover sheet by methods, such as roller coating or by spraying solutions or dispersions of the materials.

The invention will now be described in greater detail by way of specific examples.

EXAMPLE 1

A dry film is prepared in accordance with the invention having a cover sheet which is a 50μ thick sheet of PET, a 2.5μ top coat which is 10 weight percent of the hydrolyzed polyvinyl acetate/acrylic acid copolymer described above, and 90 weight percent hydroxyethyl cellulose, a photoimageable composition forming a layer 50μ thick and a polyethylene protective sheet 25μ thick. The photoimageable composition is formulated as follows:

| Weight % | Ingredients: Chemical Name or Trade Name |
|---|---|
| 36.5 | Scripset 540 (styrene/Maleic Anhydride Co-Polymer) |
| 25.8 | MEK |
| 1.2 | Pigment CI 7426 |
| 0.05 | Sterically hindered phenol anti-oxidant |
| 7.54 | Tripropylene glycol diacrylate |
| 3.76 | Tripropylene propane triacrylate |
| 0.33 | Adhesion Promoter of the Thiazole type |
| 2.81 | N-Methylolacrylamide |
| 2.26 | Dimethoxyphenyl Acetophenone |
| 0.56 | Coating Aid |
| 1.18 | Methyl Ethyl Ketone |
| 18.01 | Fillers |
| 100% | |

EXAMPLE 2

A dry film is prepared in accordance with Example 1, using LAMINAR ® DM to form the photoimageable composition layer.

EXAMPLE 3

Panels having copper traces and plates having tin-/lead traces were each cleaned in a conventional manner. The dry film of Example 2 was applied to the boards both manually and with an automated system. Manually, the polyethylene protective sheet was removed and the four corners of the film were tacked down with only finger pressure. Using tape to obtain a grip, the cover sheet was removed by drawing off the PET cover sheet in a plane parallel to the board surface. In the automated variation, a Dynachem DFSM Model 360 laminator was used. The Dynachem apparatus uses an "off contact" method which automatically removes the polyethylene protective sheet, tacks down the leading edge of the dry film and then tacks down the trailing edge of the dry film. Application was to both sides of the boards. Then the cover sheet was removed.

Lamination was effected at a platen temperature of 70° C. with a cycle time of 50 seconds and a vacuum of 2 millibars. Mechanical slapdown was for 6 seconds at a vacuum of 0.3 millibar. The boards were held 20–30 minutes.

Artwork was laid over the boards. Using Colight DMVL-824, exposure was for 25 seconds at 100 mJ/cm$^2$ measured by Dynachem's integrating radiometer model 500, achieving a Stouffer step of 8 to 9. The boards were held for an additional 20–30 minutes. The boards were developed in 1.0 weight percent $Na_2CO_3 \cdot H_2O$ which gave a 2× break point. The boards were dried using a Chemcut 547 circuit board dryer. Curing was done using a Dynachem UVEX curing unit, an IL-390 unit and a high temperature oven. Curing steps are as follows:

U.V. CURING

1. UVEX-3 lamp (200 watt/inch).
2. 3.5 Joules/cm$^2$ (IL-390) side A.
3. Cool to room temperature.
4. 3.5 Joules/cm$^2$ (IL-390) side B.
5. Cool to room temperature.

THERMAL CURE

1. Oven bake at 150° C. for 60 minutes.

EXAMPLE 4

Figure 6:
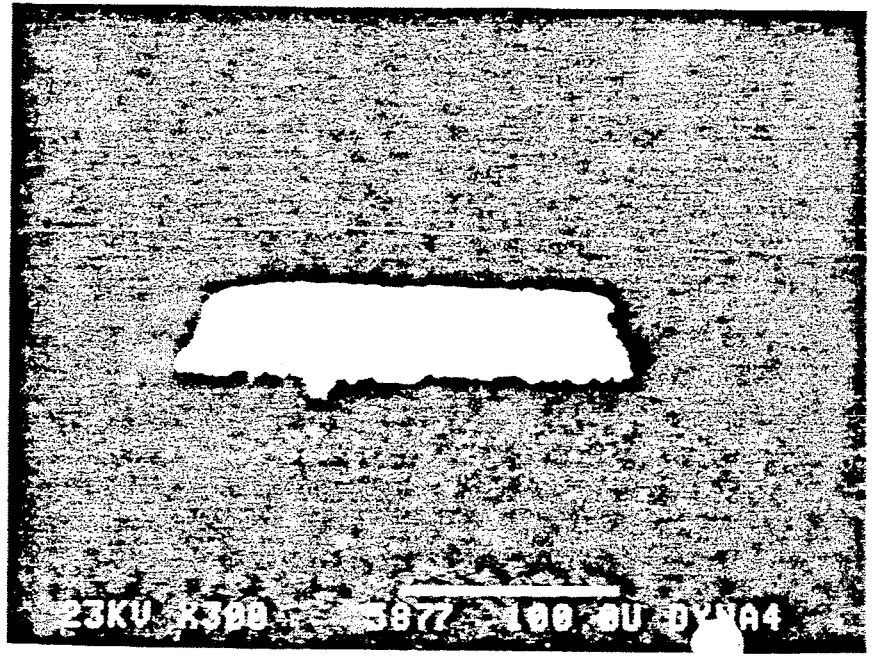
FIGS. 6–9 are each photographs of a perpendicular slice of a printed circuit board having a solder mask prepared using a dry film in accordance with the present invention, the photographs being taken at an angle of 60° relative to the plane of the board so as to show both the cross-section of the board and the outer surface of the photomask.

FIG. 6 shows a solder mask formed from a 50μ layer encapsulating a 50μ trace.

Figure 7:
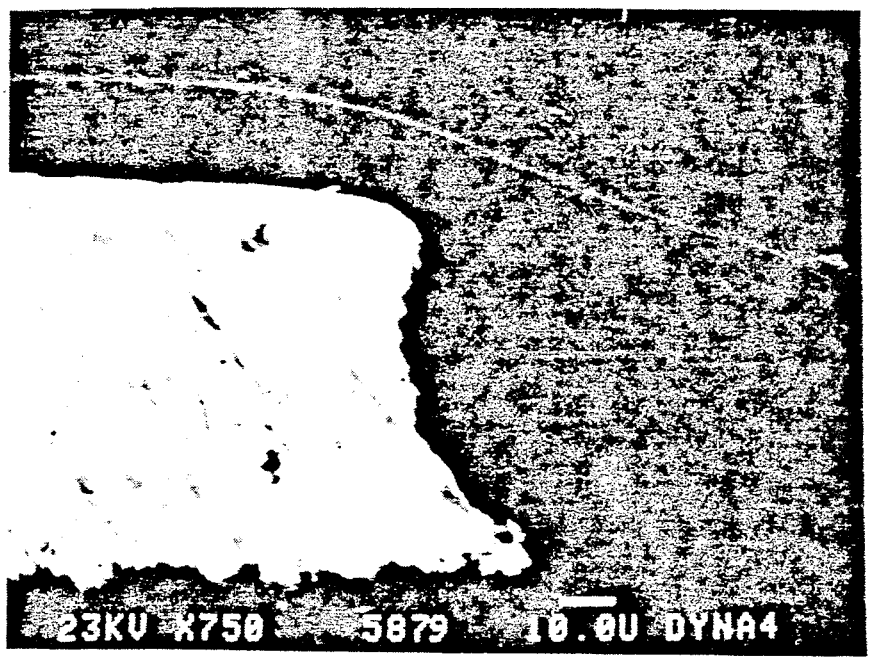

FIG. 7 shows a solder mask formed from 50μ layer encapsulating a 75μ high trace. Excellent coverage at the regions of the knees is seen.

Figure 8:
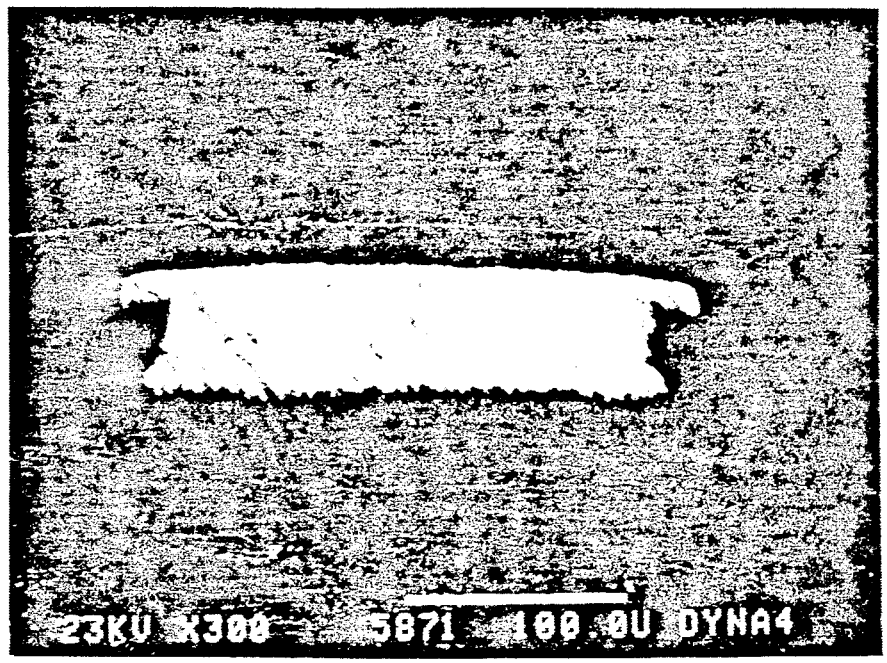

FIG. 8 shows a solder mask formed from a 50μ layer encapsulating a 50μ high trace having overhangs. Solder mask material filling the regions below the overhangs is seen.

Figure 9:
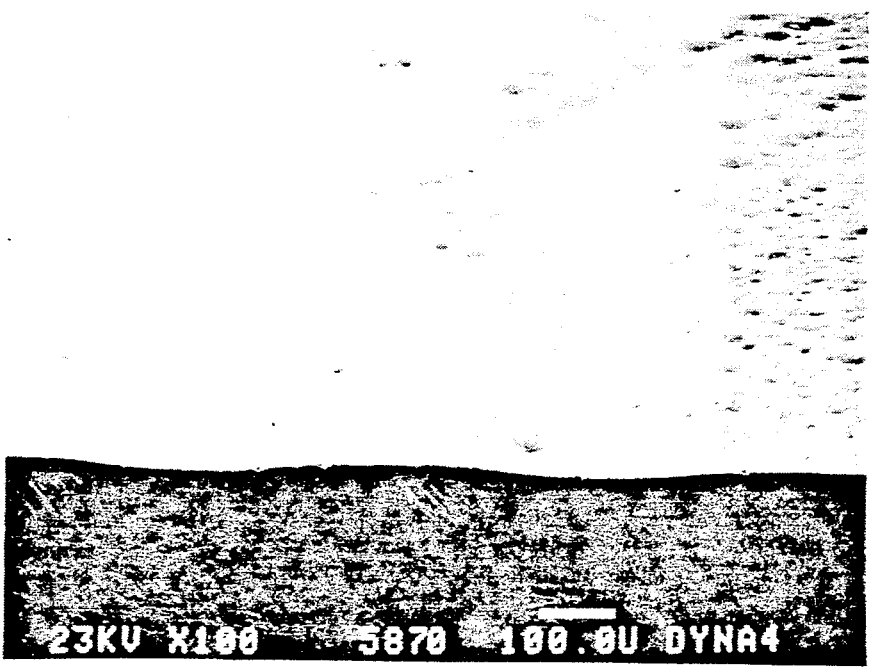

FIG. 9 shows a solder mask formed from a 50μ layer encapsulating 50μ high trace. Conformance of the solder mask to the contours of the circuit board is seen.

Although the invention is most pertinent to and has been described primarily in respect to a dry film carrying a photoimageable composition layer which is curable to form a solder mask, the invention is generally applicable to a dry film having any primary imaging product, including primary photoresists, to be applied to an irregular surface, particularly a surface from which traces rise from an otherwise flat surface. It may also be desirable to use the method of the present invention to apply a layer of primary photoresist to a copper surface with unevenness caused by "fatglass". There are instances, for example, where it is desirable to lay a photoresist layer over a patterned circuit which is already formed and then either add or subtract existing copper patterns or tab plate gold fingers.

EXAMPLE 5

Figure 10:
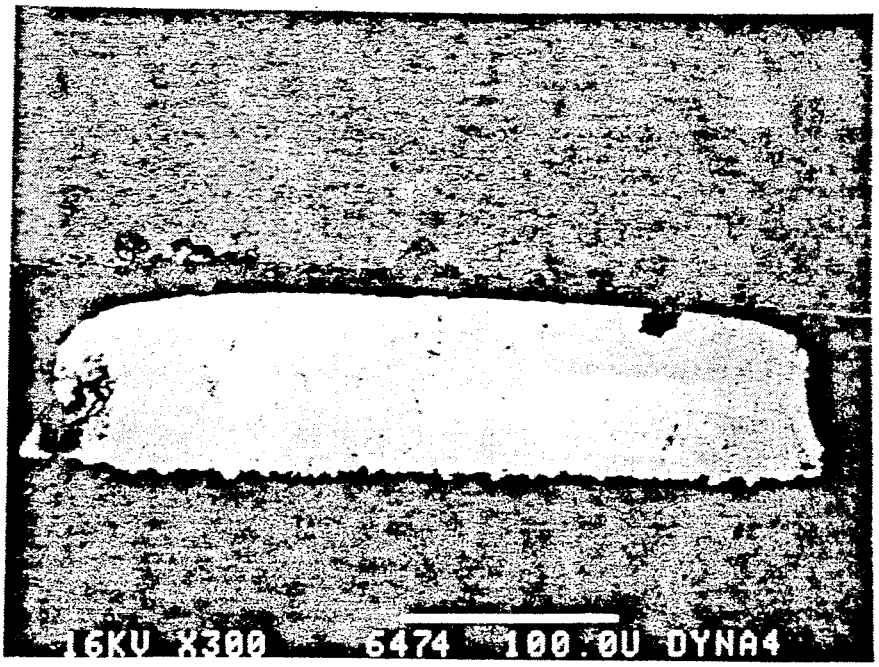
FIG. 10 is a 300× magnification of a primary photoresist applied by the method of the present invention over a circuit board having traces.

A dry film is prepared in accordance with Example 1, using Laminar ®AX to form a photoimageable composition layer. The resist was laminated over raised connector tabs, as per Example 3, and exposed to an image to a solid copper 7-9 on a Stouffer ®21 Step Sensitivity guide. A covered trace is seen in FIG. 10. The exposed panel was then developed in a Chemcut 547 spray developer containing 91 liters water, 3% by weight potassium carbonate and 1 to 5% Butyl Cellosolve ® which bared about ¾ of each connector pad. Developer temperature was held between 27°-33° C. After thorough rinsing, the board given a 0.30 mil nickel strike followed by 30 min. gold plating cycle in a Technic RC-80 bath. The resist was then stripped in a 3-5% NaOH at 54°-60° C. The gold plated tabs were then inspected for wicking in the areas around which the resist had conformed. No traces of Au or Ni were found anywhere above the gold plated areas. A control, not vacuum laminated in this fashion, showed wicking on about 25% of the tabs.

The excellent conformability achieved by the laminated dry film in accordance with the present invention might also be achieved with a dry film comprising a layer of photoimageable material backed by a cover sheet of deformable material, e.g., heat-conforming vacuum film. Such a dry film would be applied in the manner of conventional film, heat/vacuum laminating being effected either during or subsequent to application to the circuit board. The cover sheet, in this case, would provide the desired conformance; handling problems of the more flexible sheet might be encountered.

In a variation of the method of the present invention, after the cover sheet is removed and prior to vacuum/heat lamination, a flexible sheet, e.g., Tedlar or Teflon, is laid over the top coat. During vacuum lamination, the flexible sheet conforms to the top coat, but can be and is removed prior to or after exposure to allow development. A reason for applying such a flexible sheet is to lengthen the permissible period of time between lamination and exposure of the photoimageable layer. Flexible sheet material may be a polymeric material or a thin sheet of paper.

While the method of the invention has been described primarily in terms of a dry film comprising a cover sheet, a top coat on the cover sheet, and a layer of photoimageable composition on the top coat, the method of the invention may be practiced using a conventional dry film comprising a cover sheet and a photoimageable layer, e.g., either a primary photoresist or a solder mask-forming photoimageable composition which is in direct contact with the cover sheet. Such a conventional dry film may optionally contain a protective sheet covering the photoimageable layer. The method may be practiced with a conventional dry film, provided that the layer of photoimageable composition tacks to a surface with sufficient adhesion relative to the adhesion between the photoimageable composition and the cover sheet that the cover sheet may be removed from the photoimageable composition, leaving the photoimageable layer tacked to the surface. After the cover sheet is removed, the photoimageable layer may be covered by a sheet of flexible material, such as Tedlar or Teflon (polytetrafluoroethylene). Such a flexible material facilitates contact printing and prevents the photoimageable composition layer from sticking to parts of the vacuum laminator. Alternatively, blankets in the vacuum laminator may consist of flexible materials. The photoimageable composition layer is laminated to the surface with heat and vacuum, conforming the photoimageable composition layer to the surface. The photoimageable composition layer is exposed to patterned actinic radiation, e.g., by off-contact printing, such as by means of a Tamarack Exposure source. If a flexible sheet has been applied, it is removed, either before or after exposure. The photoimageable composition layer is then developed. If the photoimageable layer is a solder mask-forming composition, it is cured.

While the invention has been described in terms of certain preferred embodiments, modifications which would be obvious to one with ordinary skill in the art may be made without departing from the scope of the invention.

Various features of the present invention are set forth in the following claims.

What is claimed is:

1. A composite comprising:
   a non-conducting substrate having a flat surface,
   circuitry traces extending upward of said flat surface of said non-conducting substrate,
   a photoimageable composition layer having an average thickness equal to or less than the height of said circuitry traces above said non-conducting substrate, said photoimageable composition layer overlying said non-conducting substrate and being conformed so as to fully encapsulate said circuitry traces to a thickness of at least about 18μ, said photoimageable composition layer being soluble in a developer and capable of being rendered insoluble to the developer when exposed to actinic radiation, said photoimageable layer being curable after sequential steps of exposure to patterned actinic radiation and development in the developer to provide a hard, permanent solder mask overlying said non-conducting substrate and encapsulating said circuitry traces, and a continuous oxygen-barrier layer overlying said photoimageable composition, said oxygen-barrier layer having a thickness of between about 1 and about 5μ, said oxygen-barrier layer being soluble in a developer for said photoimageable composition layer.

2. A composite according to claim 1 wherein said photoimageable layer is developable in alkaline aqueous solution and said oxygen-barrier layer is soluble in alkaline aqueous solution.

3. A composite according to claim 1 wherein said circuitry traces have flat upper surfaces and lateral knees, the thickness of said photoimageable composition layer in the region of said lateral knees being at least about 70% of the thickness of said photoimageable composition layer over the top surfaces of said circuitry traces over about 90% of the linear extent of said circuitry traces.

4. A composite in accordance with claim 1 wherein said photoimageable composition layer and said continuous oxygen-barrier layer are vacuum-conformed to said non-conducting substrate and said upwardly extending circuitry traces.

5. A printed circuit board comprising a flat, non-conducting board, conducting traces elevated above the surface of said board, said traces having flat upper surfaces and lateral knees, and a solder mask covering a major portion of said circuit board, including such traces, said solder mask being the cured product of a photoimageable layer applied to said board as a dry film, said solder mask having an average thickness of about equal to or less than the elevation of said traces, the thickness of said solder mask in the region of said lateral knees being at least about 70% of the thickness of said solder mask over the top surfaces of said traces over about 90% of the linear extent of said traces.

6. A printed circuit board according to claim 5 wherein said solder mask has an average thickness of about 50μ or less.

7. A printed circuit board according to claim 5 wherein said solder mask substantially conforms to the contours of said circuit board.

8. A printed circuit board according to claim 5 wherein said solder mask is vacuum-conformed to said non-conducting board and said elevated conducting traces.

9. A printed circuit board according to claim 5, said traces having feed and lateral overhangs extending beyond said feet, said solder mask substantially conforming to the contours of said circuit board so as to substantially eliminate voids below said overhangs.

10. A printed circuit board comprising a flat, non-conducting board, conducting traces elevated above the surface of said board, said traces having feet and lateral overhangs extending beyond said feet, and a solder mask covering a major portion of said circuit board, said solder mask being the cured product of a photoimageable layer applied to said board as a dry film, said solder mask having an average thickness of about equal to or less than the elevation of said traces, said solder mask conforming to the contours of said circuit board so as to form a layer at least about 18μ thick over said traces and to substantially eliminate voids below said overhangs.

11. A printed circuit board according to claim 10 wherein said solder mask has an average thickness of about 50μ or less.

12. A printed circuit board according to claim 10 wherein said solder mask is vacuum-conformed to said non-conducting board and said elevated conducting traces.

* * * * *